May 16, 1967 P. C. OLSEN 3,320,504
PLURAL MOTOR SEQUENTIAL TUNING CONTROL SYSTEM
FOR TELEVISION RECEIVERS
Filed Nov. 12, 1963 3 Sheets-Sheet 1

INVENTOR.
PERRY C. OLSEN
BY Eugene M. Whitacre
Attorney

INVENTOR.
PERRY C. OLSEN
BY Eugene M. Whitacre
Attorney

INVENTOR.
PERRY C. OLSEN
BY Eugene M. Whitacre
Attorney

United States Patent Office 3,320,504
Patented May 16, 1967

3,320,504
PLURAL MOTOR SEQUENTIAL TUNING CONTROL SYSTEM FOR TELEVISION RECEIVERS

Perry C. Olsen, Indianapolis, Ind., assignor to Radio Corporation of America, a corporation of Delaware Filed Nov. 12, 1963, Ser. No. 322,843
8 Claims. (Cl. 318—102)

The present invention relates to tuning control systems for television receivers of the type wherein a UHF or ultra high frequency tuner is combined with a VHF or very high frequency tuner to cover two television bands.

The VHF tuner of such receivers is generally of the rotary step-by-step channel-tuning type having detent-controlled channel-selector stop positions over a full 360° rotation of the tuning shaft, for each of the twelve VHF-band channels. The associated UHF tuner in a television receiver of this type may be of the rotary continuous-tuning type covering the seventy channels in the high-frequency UHF band during a full rotation of the tuning shaft. Simplified preset channel tuning and fine tuning through the UHF band as well as the VHF band is desirable in such combined VHF–UHF television receivers.

It is therefore, an object of this invention to provide an improved and simplified tuning system for combined VHF–UHF two-band television receivers, capable of continuous sequential preset channel tuning through both of the two television bands and also capable of continuous sequential preset tuning through only a selected one of the two television bands.

It is also an object of this invention to provide an improved tuning system for combined VHF–UHF television receivers, with effective step-by-step channel selection for the UHF as well as the VHF band under control of a single manual operating element.

It is also a further and important object of this invention to provide an improved motor-driven VHF–UHF tuning system for television receivers which operates to effect channel tuning stops in sequence and channel programming in both the VHF and UHF bands, whereby the tuning system may be selectively controlled to tune through the UHF and VHF television bands in sequence, or to tune repeatedly through only one of said UHF and VHF television bands.

A tuning control system in accordance with one embodiment of the invention includes two detent-controlled rotary elements, one for the VHF band tuner and one for the UHF band tuner. Separate electric motors are provided for rotating the two rotary elements through their detent positions. A power control circuit is provided for the electric motors which permits energization of one of the motors by a single manually operated control means. The control circuit includes switching elements which are driven by the respective electric motors in such a manner that the power circuit is completed to a first of the motors for each successive actuation of the manually operated control means until a reference position of the rotary element driven by the first motor is reached.

With the first electric motor deenergized in the reference position, the switching means changes the control circuit to apply power to the second electric motor the next time the manually operated control means is actuated. Further actuations of the manually operated control means causes the second motor to drive its associated rotary element from one detent position to the next until a reference position is reached for this rotary element. With the second motor deenergized in the reference position of the rotary element, the control circuit is switched to apply power to the first motor the next time the manually operable means is actuated. In this manner, the first and second motors may be sequentially energized to sequentially tune the VHF and UHF tuners through their respective channel positions.

If desired the tuning of either one of the tuners through its frequency band may be repeated, and the sequential operation of the tuners may be eliminated, by maintaining the manually operable means in its activated position during the time that the rotary element associated therewith is in its reference position.

The invention will, however, be further understood from the following description when considered in connection with the accompanying drawings showing certain embodiments of the invention and its scope as pointed out in the appended claims.

Figure 1:
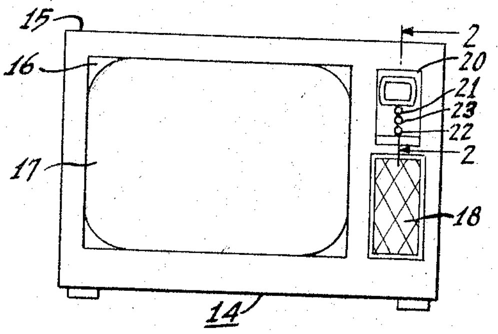
FIGURE 1 is a front view, in elevation, of a combined VHF–UHF television receiver provided with a tuning system embodying the invention.

Referring to the drawings, wherein like elements and parts are designated by like reference characters throughout the various figures, and referring particularly to FIGURE 1, a combined VHF–UHF television receiver 14, for which the invention is adapted, may be of any suitable type such as a table model as shown. The receiver 14 has a casing 15 in which is located the usual large frontal viewing opening or window 16 for the face of a kinescope or picture tube 17, together with a grilled loudspeaker opening 18 and a metallic or like operating panel 20.

The operating panel 20 also includes three movable manual control elements 21, 22 and 23. Control elements 21 and 22 are connected with the interior operating mechanism of the tuning system and are adapted for rotation in either direction and for longitudinal movement away from the panel. As will hereinafter appear, rotation of the upper knob 21, when withdrawn away from the panel, serves to provide fine tuning, preset tuning and programming adjustments of the system for the VHF tuner, while rotation of lower knob 22 when withdrawn serves to provide these same functions for the UHF tuner. Intermediate knob 23 is a push button or touch bar that initiates all channel changes.

Figure 2:
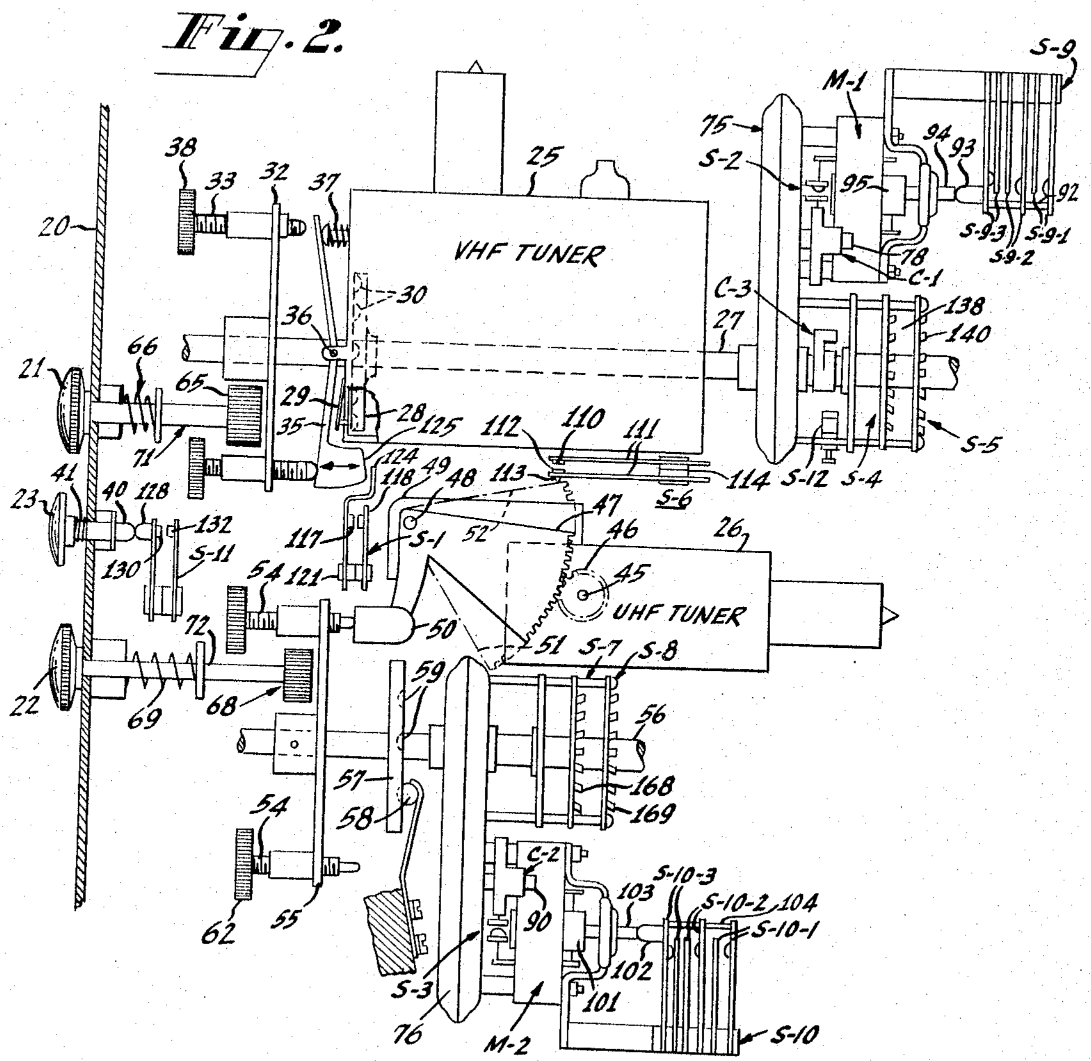
FIGURE 2 is an enlarged sectional side view, in elevation, of the tuning system of the receiver of FIGURE 1, taken on the section line 2—2, and showing the operational arrangement and construction thereof in accordance with the invention.
Figure 3:
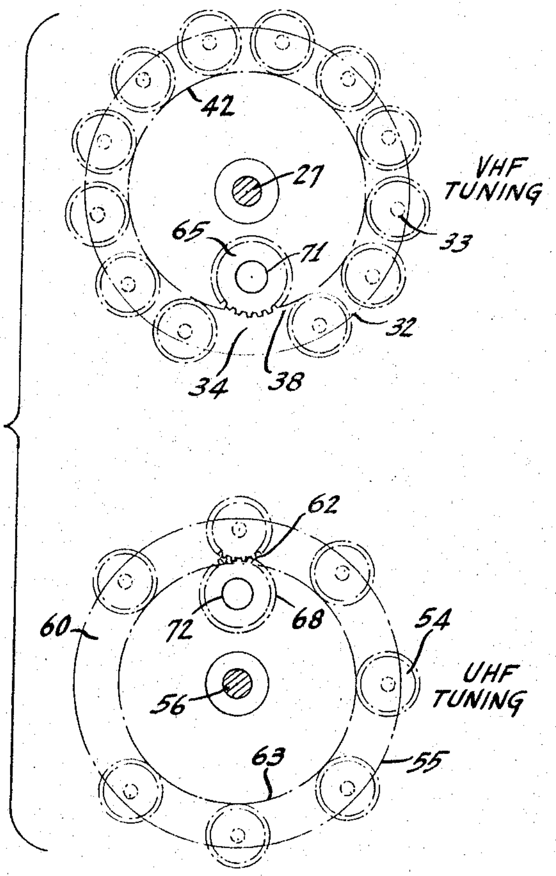
FIGURE 3 is a front-end view of a portion of the tuning system of FIGURE 2 schematically showing the construction and operation of certain elements thereof.

Referring now to FIGURES 2 and 3, along with FIGURE 1, and with particular reference to FIGURE 2, it will be seen that the tuning system in rear of the control panel 20 includes a VHF or low-frequency tuner 25 and a UHF or high-frequency tuner 26. The VHF tuner is of the usual step-by-step tuning type having a tuning control shaft 27 which extends therethrough and is rotatable through one full 360-degree turn in thirteen angularly-spaced stops or positions, twelve of which are for channel tuning (Channels No. 2-13 inclusive) and with reference position wherein the tuner is out of operation during the UHF tuning operation.

To establish the channel tuning stops or positions for the tuning shaft 27, resilient detent means may be provided in connection therewith. This is shown by way of example as a rotating detent disk 28 attached to the shaft and with which there is provided a fixed spring-pressed detent 29 operable in connection with corresponding spaced detent notches 30 as indicated in FIGURE 2. This detent means represents any suitable means of this type for resiliently stopping and holding the tuning shaft 27 of the VHF tuner 25 in any one of the channel-tuning stops or positions, and the UHF or reference position.

The VHF tuner is also provided with a thirteen-position turret 32 which is mounted on the tuning shaft 27 between the tuner 25 and the panel 20, as indicated. This carries twelve rotatable fine tuning elements or tuning adjustment screws 33, extending through the turret in a circular row near the periphery thereof and angularly spaced and in parallel relation to each other, as indicated in FIGURES 2 and 3. It will be noted that the row of tuning screws includes a reference position 34 for UHF operation. As the turret 32 rotates with the tuning shaft 27 through the various tuning positions for channels No. 2–13 and the reference position, the tips of the tuning screws progressively come in contact with one end of a fine tuning control lever 35 of the VHF tuner to move it to different positions for fine tuning the VHF channels. The lever is spring-loaded so that it presses against the tuning screws, as shown in FIGURE 2 for example, and pivots about a fulcrum point or axis indicated at 36 on the tuner 25. A spring-loaded fine-tuning plunger 37, connected with internal VHF fine tuning means (not shown) is in contact with the tuning lever as indicated in FIGURE 2 and is thus moved in response to movement of the lever.

The heads 38 of the tuning screws 33 are pinion-gears 38 which, when turned clockwise or counterclockwise by a tuning gear 65, move the screws in or out with respect to the tuning lever and thus adjust the fine tuning of the VHF channels at each stop position.

As will be seen, the tuning gear 65 is mounted on a rotatable and longitudinally movable control shaft 71 which passes through the panel 20 and is connected with the control knob 21. The gear and knob are moved outward manually against the holding force of resilient biasing means, such as a spring 66 connected with the shaft, to bring the gear 65 into mesh with and rotate the respective pinion-gears 38 as they come into position for setting the tuning of each channel.

From the view of the turret 32 in FIGURE 3, it will be seen that the tuning adjustment screws are equally spaced in a circle about the turret axis. The pinion-gear heads of the screws project from the turret into a common circular path, indicated by the dot-and-dash line 42, in which they move to mesh successively with the tuning gear 65 as the turret is rotated to each dented stop position and the gear 65 is retracted forwardly by the control knob 21.

The UHF or high-frequency tuner 26, in the present example, is a rotary and continuously-tunable type, having an operating or tuner shaft 45 on which is mounted a pinion-gear 46 driven by movable gear segment 47. The gear segment is mounted to move about a pivot pin 48 on a fixed bracket 49 and is connected with a curved rocker arm 50. The rocker arm is spring loaded by suitable means (not shown) to move to the left as viewed in FIGURE 2 and thus drive the pinion-gear 46, through the gear segment 47 connected therewith, and rotate the tuner shaft 45. This movement carries the tuner through its full tuning range which, in the present example, may be assumed to cover the UHF band of channels No. 14–83 inclusive. The limits of movement of the gear segment 47 are indicated generally by the dotted lines 51 and 52.

Successively engaging the rocker arm 50, as it is biased to move to the left, is a second set of tuning screws 54, similar to the tuning screws 33 for the VHF fine tuning, and similarly mounted in a turret or turret head 55 in circular concentric coaxial relation to the turret axis and adjacent the periphery thereof. This is shown more clearly in FIGURES 3 along with FIGURE 2. The UHF turret 55 is mounted on a tuning drive shaft 56 which rotates in spaced and generally axially-parallel relation to the VHF tuner shaft 27. This likewise carries detent means represented by a detent plate 57 and a spring pressed detent ball 58 for the UHF turret 55.

In the present example there are seven tuning screws 54 in the 360-degree space of one turn of the UHF tuning turret 55, with a blank or reference position or space 60 in the circular line of screws, as indicated in FIGURE 3. Accordingly, eight angularly-spaced detent notches 59 are provided in the detent plate 57. However, any suitable number of stop or tuning positions may be selected depending upon how many UHF channels may be available in any area in which the television receiver is to be operated.

For UHF tuning, the screws 54 are provided with pinion-gear heads 62 which are successively brought into line for meshing engagement with the tuning gear 68, as the UHF turret 55 is rotated. Retraction of the gear 68 by the knob 22, in a forward direction, now causes it to mesh with the successive pinion-gears or gear heads 62 to rotate the tuning screws and provide tuning adjustment for the UHF tuner at the various stop positions, and thereby to select desired channels successively through the UHF band up to the number of detent positions, less the reference position. These may be increased or decreased from the number shown, as may be desired.

As indicated, the ends of the tuning screws meet the rocker arm or tuning lever 50 and move it to drive the tuner shaft 45 to the desired tuning positions which may then be set by rotation of each tuning screw by the gear 68 under control of the knob 22 for each selected channel. The circular path of movement for the pinion-gears 62 of the UHF turret 55 is indicated by the dash-and-dot line 63 in FIGURE 3, in which they move to mesh successively with the tuning gear 68 as the turret is rotated to each stop position and the gear 68 is retracted by the control knob 22.

The UHF tuner or turret means provides seven detent positions for the selection of UHF channels and one reference position to permit the selection of VHF channels. The VHF tuner has twelve tuning detent positions covering Channels No. 2–13 and one reference detent or "UHF" position at which the VHF tuner circuit may be inactive or be used as desired for other purposes such as an I.-F. amplifier for a converted UHF signal, while the tuning of the UHF channels may be carried out without disturbing the fine-tuned settings of the VHF channels.

Separate or individual electric-motor drive means are provided for the two tuners. The VHF or low-frequency tuner and its connected turret element are driven by electric-motor means comprising an electric motor M–1 connected, through its associated reduction gearing or gear train 75, with the tuning shaft 27 as indicated in FIGURE 2. In a similar manner the turret 55 and the tuning mechanism for the UHF or high-frequency tuner 26 is provided with electric-motor drive means comprising an electric motor M–2 connected through its individual associated reduction gearing or gear train 76 with the turret shaft 56. The tuner and turret shafts are thus the main output shafts of the gear trains in this case.

The individual motors are operated selectively to drive the UHF and VHF tuners through the detent-stopped VHF and UHF channel tuning positions. Each motor may be of the known spring-loaded solenoid-armature type whereby, when power is applied, a pinion on the armature shaft is axially moved to engage the gear train to drive the tuner. When the power is removed from the motor, the spring loading immediately becomes effective to withdraw the armature to its original position thereby permitting it to coast while disengaged from the gear train. This type of geared electric-motor, being known, requires no further detailed description.

The axial movements of the motor armatures in the solenoid-armature type motors are used to actuate the motor run switches S–9 and S–10 in VHF and UHF operation respectively rather than a relay or other similar device. When power is removed from M–1, the spring loading that withdraws armature 95 from the solenoid-armature field of M–1, may also depress the insulating button 93 on S–9 through armature shaft 94. S–9 may be a resilient multiple spring leaf type switch with the various sections of the switch connected as shown in FIGURE 2 with an insulating rod 92. The pressure of armature shaft 94 on the insulating button 93 when the motor M–1 is deenergized results in actuating the switch S–9 to the position shown in FIGURE 2, opening contacts S–9–1 and S–9–2 while closing contact S–9–3. When power is applied to M–1 the armature shaft 94 pressure is withdrawn from insulating button 93 and the leafs of switch S–9 spring back to an alternate position closing contacts S–9–1 and S–9–2 while opening S–9–3.

Drive motor M–2 for the UHF tuner operates in the same manner. Whenever M–2 is de-energized, armature 101 spring loading will depress insulating button 102 on S–10 with armature shaft 103. S–10 is also a multiple spring leaf type switch with the individual switch sections connected with insulating rod 104 actuating the various sections of switch S–10 in the position shown in FIGURE 2. Application of power to M–2 will cause switch S–10 to be actuated to its alternate position from that shown in the drawings.

To de-energize the motor M–1 at the detent positions of the tuner 25, an auxiliary output shaft 78 for the motor gearing 75 is provided and geared in a 6½:1 ratio to the VHF tuner shaft 27 and the detent stop means thereon. A cam C–1, attached to the auxiliary shaft, operates a VHF detenting switch S–2. In the construction shown more clearly in FIGURE 5, the cam C–1 has two lobes 79 and 80 which successively engage an insulated operating button or finger 81 on a switch blade 82 of the switch S–2 to hold a movable contact 83 separated from a fixed contact 84 carried by a second switch blade 85. The two switch blades are mounted in a suitable insulating block 86 and have terminals as indicated to which circuit leads 87 may be connected.

The two cam lobes 79 and 80 are equally spaced 180 degrees apart, so that for each revolution of the VHF tuning shaft 27 and the detent stop means, there are thirteen makes and breaks of the switch S–2 corresponding to the thirteen stop positions defined by the detent means. The contacts 83 and 84 are closed when the lobes 79 and 80, which are relatively narrow, are retracted out of contact with the operating finger 81. Thus the purpose of the cam-and-switch means is to insure proper detenting of the tuner at each channel position. As hereinafter will be seen in considering the circuit connections for the system, the motor M–1 is cut off or deenergized by opening of the contacts 83–84 just before the tuner detents into the next channel position, so that the tuner definitely comes to a stopped fully-detented position without overdrive by the motor means.

Figure 5:
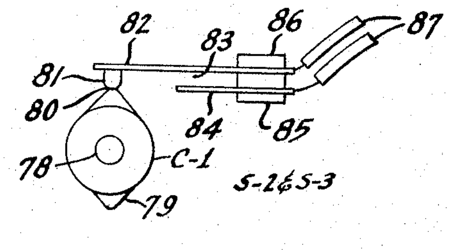

The drive motor M–2 and its gear 76 for the UHF tuner turret 55, operates in the same manner as that for the VHF tuner except for the number of stop positions. The main output shaft for the gearing or reduction gear train 76 is the turret or UHF tuning shaft 56. The gearing also includes an auxiliary output shaft 90 on which is mounted a second detenting control cam C–2. The latter is positioned to operate an associated control switch S–3, like the switch S–2 and in a similar manner, as shown in FIGURES 2 and 5.

In this case the auxiliary output shaft 90 has a different ratio to the main output or turret shaft 56 so that it synchronizes with the UHF detented channel positions being utilized for the selected number of channel positions. With eight positions as in the present example, the auxiliary shaft 90 has a reduction ratio of 4:1 with respect to the tuner or turret shaft 56. Therefore, since the cam C–2 likewise has two lobes equally spaced as described, for each revolution of the shaft 56 it provides eight makes and breaks of the switch S–3, or one for each position at which the tuner may stop. As in the VHF tuner, the UHF detenting control switch opens when the tuner is a few degrees, such as three degrees for example, from each detented stop position, as determined by the turret 55 and its detent means 57–58. This type of control insures, as for the VHF tuner, that the UHF tuner stops without override in each of the detented stop positions.

The energizing power control circuit for the motors M–1 and M–2 includes switches S–4, S–5, S–7 and S–8 as shown in FIGURE 2 which are mounted on and actuated by the respective turret or tuner shafts 27 and 56. These switches are of the two gang multiple position wafer type.

The wafer switches S–4 and S–5, which are driven by the motor M–1, each have 13 stationary contacts 138 and 140 respectively and a rotor element 136 and 142 respectively. This provides 12 contact positions corsponding to the 12 VHF channel positions and one contact position corresponding to the reference position. The rotor elements 136 and 142 are both locked to the shafts 27.

The wafer switches S–7 and S–8, which are driven by the motor M–2, each have 8 stationary contacts 168 and 169 respectively and a rotor element 166 and 194 respectively. This provides 7 contact positions corresponding to the number of 7 UHF detent positions and one contact position corresponding to the reference position. The rotor elements 166 and 194 are both locked to the shaft 56.

Figure 6:
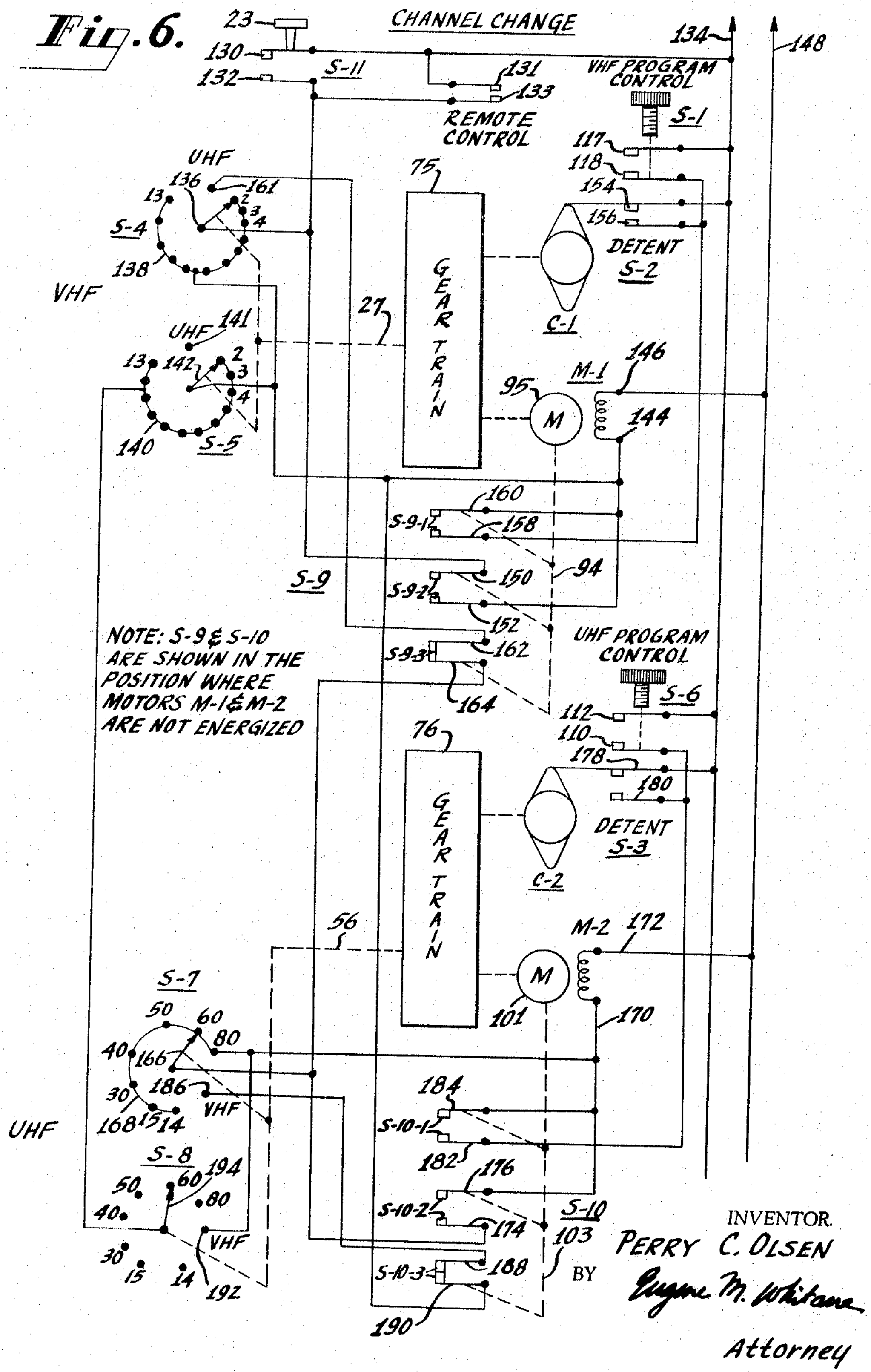
FIGURE 6 is a schematic circuit diagram of the tuning system of FIGURES 1 and 2 showing the electrical and functional arrangement thereof for operation in accordance with the invention.

In the circuit diagram of FIGURE 6 it will be seen that the structural and circuit elements are shown in substantially the same operative relation as in FIGURE 2. The switches S–2 and S–3 are shown in operative relation to their respective cam elements C–1 and C–2, which are connected with the respective gear trains 75 and 76. The motor M–1 is shown connected to the gear train 75 and the motor M–2 is shown connected to the gear train 76. The driving connection between the gear train 75 and the VHF tuner is indicated by the dotted representation of the shaft 27 on which the rotors 136 and 142 of switches S–4 and S–5 are shown mechanically connected. Likewise the gear train train 76 is shown connected with the UHF tuner through the dotted representation of the tuner shaft 56 on which the rotors 166 and 194 of switches S–7 and S–8 are shown mechanically connected.

In addition to these switches there are provided VHF and UHF program control switches, which correspond to switches S–1 and S–6 as shown in FIGURES 2 and 6. The UHF program-control switch S–6 provides two contacts 112 and 110 mounted on spring arms 111 in a fixed insulating supporting means 114. One of the arms is provided with an insulating finger 113 positioned to meet the gear segment 47 at the limit of its travel in response to movement of the lever arm 50 by any of the tuning screws 54 when rotated to an extreme tuning position inwardly or rearwardly. The VHF program-control switch S–1 also has two contacts 117 and 118 normally in the open position as shown.

To provide the VHF programming control function, the switch blade for the contact 117 is extended forwardly and formed, as shown, with an extended finger element 124 adapted to be engaged by a curved or cam end 125 of the fine-tuning lever 35 which is contacted by the tuning adjustment screws 33. With this connection, when a tuning screw 33, for any particular stop position, is turned in or extended fully by rotation to an extreme or limit position under control of the tuning gear 65 and the control knob 21, and screw actuates the curved portion 125 of the fine-tuning lever 35, then the lever 35 meets and moves the switch blade extension or finger element 124 to close the contact 117 against the contact 118, thereby closing the switch S-1.

Channel programming is therefore accomplished by presetting the tuning screws to close the program switches S-1 and S-6 at the unwanted channel detent positions in VHF and UHF tuning respectively. S-1 will keep the VHF motor M-1 energized through the corresponding VHF channel detent position while S-6 will keep the UHF motor M-2 energized through the corresponding UHF channel detent positions.

The channel change switch S-11, which initiates all channel tuning, may be a set of remote control contacts 131 and 133 (FIG. 6), on a push button type switch incorporated into the tuner using control knob 23 as shown in FIGURE 2, or a combination of both. As shown in FIGURE 2, S-11 may be provided with an insulating button 128 which is positioned to meet the end of shaft 40. Inward pressure on the control knob 23 is effective to move the end of the shaft 40 against the button 128 and thereby close switch S-11 and its contacts 130 and 132. A pair of remote control contacts 131 and 133 need only be conected in parallel with the switch S-11 contacts 130 and 132 to provide remote control channel change control along with the manual control of knob 23.

Figure 4:
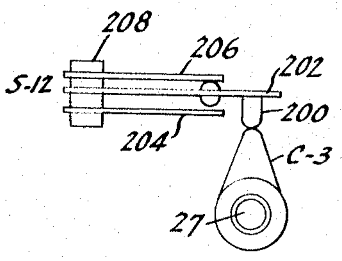
FIGURES 4 and 5 are end views on an enlarged scale of certain control switch elements forming part of the tuning system of FIGURE 2, to show the operation thereof in accordance with the invention.

FIGURE 4 shows a suitable switch S-12 that may be used to switch the signal output of the VHF tuner 25 and UHF tuner 26 to the television receiver depending upon the television band tuned to be received. The single lobe cam C-3 is shown mounted on the VHF tuning shaft 27 and is rotatable into contact with the insulating switch button 200 which is mounted on the movable switch contact 202 of switch S-12. Switch S-12 may be a resilient multiple spring leaf type switch with leaf 204, a normally closed contact and leaf 206 a normally open contact. Cam C-3 is aligned on shaft 27 wherein the cam makes contact with the insulating button 200 as shown in FIGURE 4 once each complete rotation of the VHF tuner whenever the VHF tuner is positioned in the reference position for UHF tuning. The receiver signal input line may be connected to leaf contact 202 while the VHF signal output may be connected to leaf contact 204 and the UHF signal output may be connected to leaf contact 206. Contacts 206 and 202 will only be closed when the VHF tuner is stopped at the reference position as shown in FIGURE 4, connecting the UHF tuner output to the receiver, and disconnecting the VHF tuner from the receiver. When the VHF tuner is set at any of the channel stop positions, cam C-3 is no longer in contact with the insulating switch button 200 and switch S-12 springs back to its alternate position closing contacts 204 and 202 connecting the VHF tuner output to the receiver, and disconnecting the UHF tuner from the receiver.

The various switches S-1 through S-11 are connected as shown in FIGURE 6, and the operation thereof will now be described.

Assume first that both motors M-1 and M-2 have driven the detent means to their reference positions. In such a case the rotors 136 and 142 of the switches S-4 and S-5 respectively will contact stationary terminals marked UHF, and the rotors 166 and 194 of the switches S-7 and S-8 respectively, will contact the stationary terminals marked VHF. To effect tuning, the knob 23 is momentarily depressed closing the contacts 130 and 132. This action causes power from power source lines 134 and 143 to be supplied to the motor M-1 by way of the switches S-11, S-4, the sequencing contact S-9-3, the switch S-7 and the sequencing contacts S-10-3. The motor M-1 will then drive the VHF tuner to its next programmed detent position because the VHF program control means keeps the contacts of the switch S-1 closed until just before this next position of the VHF tuning turret 32 is reached, thereby providing an alternate current path from the power lead 134 through the switch S-1 and the holding contacts S-9-1. If the VHF program control means is adjusted not to by-pass the first channel position, the motor M-1 drives the VHF tuner to its channel 2 position, with power being supplied to the motor until lthe channel 2 position is reached by way of the alternate current path provided by the detent switch S-2 and the holding contacts S-9-1.

When the VHF tuner is in its channel 2 position the rotors 136 and 142 of the switches S-4 and S-5 respectively, engage the contacts marked 2 in the drawings. In the channel 3 position the rotors 136 and 142 contact the stationary terminals marked 3, etc.

It will be noted that under the assumed conditions, that no power was applied to the motor M-2, and consequently the UHF tuner remains in the reference position. The VHF tuner is now in the first selected one of its channel selecting positions 2-13, as programmed. The second actuation of the knob 23 to initiate a tuning change causes power to be applied to both motors M-1 and M-2. When the switch S-11 is closed by momentary actuation of the knob 23, power is supplied to the motor M-1 through the switches S-11 and S-4, causing the VHF tuner to be driven to the next channel position or to the next channel position for which it is programmed under control of the switch S-1. The motor M-2 is also energized by way of the switches S-11, S-4, S-5 and S-8 causing the UHF tuner to be driven to the next detent position after its reference position for which it is programmed under control of the UHF program control switch S-6.

It should be noted that the UHF tuner will not be connected to the television receiver except when the switch S-12 (FIG. 2 and FIG. 4) is actuated, which only occurs in the reference position of the VHF tuner.

Subsequent closure of the switch S-11 energizes the motor M-1 through the switch S-4 to drive the VHF tuner to its next program channel position. However the motor M-2 is not actuated because the rotor 194 of the switch S-8 has been moved to a UHF channel selecting position as mentioned above to engage one of the numbered stationary contacts. Further actuation of the switch S-11 to initiate channel changes energizes the motor M-1 to drive the VHF tuner through successive channel positions without the motor M-2 being energized.

As the motor M-1 drives the VHF tuner into its reference detent position, and the rotors 136 and 142 of the switches S-4 and S-5 respectively engage the stationary contacts marked UHF, two options are available. First, if the VHF tuner is allowed to stop in the reference position, then the receiver will be conditioned for reception of UHF signals since the switch S-12 (FIG. 2 and FIG. 4) is actuated by the cam C-3 to connect the UHF tuner to the receiver and to disconnect the VHF tuner therefrom. It will be noted as aforesaid, that the UHF tuner is already in its first channel selecting position. Subsequent actuation of the switch S-11 causes power to be applied only to the motor M-2 through the switches S-11, S-4, the sequenching contact S-9-3, and the switch S-7. Further actuations of the switch S-11 cause the motor M-2 to drive the UHF tuner successively to the detent positions for which it is programmed.

As mentioned above, there are two options available to the television viewer when the motor M-1 drives the VHF tuner to its reference position. One of these options has been described wherein, by permitting the VHF tuner to stop in its reference position, tuning through the UHF band may be effected. The second option is to prevent the VHF tuner from stopping in its reference position by maintaining the switch S-11 closed during this interval. Under these circumstances, power is supplied to the motor M-1 through the switches S-11, and the holding contacts S-9-2 which are closed because the motor M-1 is energized. No power is supplied to the motor M-2 when the rotor 136 of the switch S-4 contacts the stationary UHF terminal because the sequencing contacts S-9-3 are open due to the energization of the motor M-1. Thus it will be seen that by maintaining the switch S–11 closed as the VHF tuner is driven through its reference position, tuning through the VHF television band may be repeated in the manner described above with no power being supplied to the motor M–2.

In like manner, when the motor M–2 drives the UHF tuner through its reference position, two options are available to the television viewer. One is to permit the UHF tuner to stop at its reference detent position wherein the rotors 166 and 194 of the switches S–7 and S–8 contact the stationary VHF terminals 186 and 192 respectively. In such case, the next subsequent actuation of the switch S–11 causes the VHF tuner to move from its reference detent position to the next programmed channel stop position.

The second option is to hold the switch S–11 closed as the UHF tuner is driven through its reference detent position, in which case power will be supplied to the motor M–2 through the switches S–11, S–4, the holding contacts S–9–3 and the holding contacts S–10–2. It will be noted that no power is supplied to the motor M–1 because the sequencing contacts S–10–3 will be opened due to the energization of the motor M–2.

If desired, tuning screws may be provided at the reference positions 34 and 60 for programming purposes. In this manner a given receiver may be programmed to tune through only one of the television bands. For example, if an extra screw is provided at the reference position 34, and is adjusted to a fully extending position so that the switch S–1 is closed when the VHF tuner reaches its reference position, the motor M–1 will remain energized and the VHF tuner will be driven to its next programmed channel position. The same type of programming may be provided for tuning only through the UHF band.

What is claimed is:

1. A motor control system comprising:

first and second electrical motors;

a first rotatable means having a plurality of detent positions and a reference position;

a second rotatable means having a plurality of detent positions and a reference position;

power circuit means including a manually operable switch;

first switching means;

means interconnecting said first switching means, said first and second motors and said power circuit means to complete a power circuit to said first motor in response to a momentary actuation of the said manually operable switch to drive said first rotatable means from one detent position to the next when said first rotatable means is in any of said detent positions, and to complete the power circuit to said second motor in response to a momentary actuation of said manually operable switch to drive said second rotatable means from one detent position to the next when said first rotatable means is in its reference position;

second switching means actuated in response to energization of said first motor to maintain the connection of said first motor to said power circuit means and to maintain the power circuit to the second motor in the open condition when said manually operable switch is held closed during the time said first motor drives the said first rotatable means through its reference position; and third switching means actuated in response to energization of said second motor to maintain the connection of said second motor to said power circuit means and to maintain the power circuit to said first motor in the open condition when said manually operable switch is held closed during the time said second motor drives said second rotatable means through its reference position.

2. A motor control system as defined in claim 1 including:

a fourth switching means;

means interconnecting said fourth switching means;

a first switching means and said power circuit means for applying power to said second motor when said first rotatable means is in one of a plurality of detent positions and said second rotatable means is in reference position wherein said second motor drives the second rotatable means from its reference position to a detent position therefor.

3. A motor control system defined in claim 2 including:

fifth switching means applying power to said first motor whenever said first motor is initially energized and including a switch actuated by a cam driven by said first motor to open at angular positions just preceding each detent and reference position of the first rotatable means;

sixth switching means applying power to said second motor when said second motor is initially energized, including a switch actuated by a cam driven by said second motor to open at angular positions just preceding each detent and reference position of the second rotatable means.

4 A motor control system defined as in claim 3 including:

a plurality of angularly spaced adjustable control elements mounted on said first rotatable means corresponding to said plurality of detent positions;

a plurality of angularly spaced adjustable control elements mounted on the second rotatable means corresponding to said plurality of detent positions;

seventh switching means;

the control elements of said first rotatable means being adjustable to selectively actuate, successively, said seventh switching means as said first rotatable means is driven from one detent position to the next;

eighth switching means;

the control elements of said second rotatable means being adjustable to selectively actuate, successively, said eighth switching means as said second rotatable means is driven from one detent position to the next;

means connecting said seventh switching means to maintain the power circuit to said first motor completed when said first motor drives said first rotatable means through a given detent position where the control element of said first rotatable means corresponding to said given detent position is adjusted to actuate the seventh switching means;

means connecting said eighth switching means to maintain the power circuit power to said second motor completed when said second motor drives said second rotatable means through a given detent position where the control elements of said second rotatable means corresponding to said given detent position is adjusted to actuate the eighth switching means.

5. A motor control system comprising:

first and second electrical motors;

a first rotatable means having a plurality of detent positions and a reference position;

a second rotatable means having a plurality of detent positions and a reference position;

power circuit means including a manually operable switch;

first switching means driven by said first motor;

second switching means driven by said second motor;

a third switching means actuated in response to the energization of the said first motor;

a fourth switching means actuated in response to the energization of said second motor;

means interconnecting said power circuit means, first switching means and said first motor to drive said first rotatable means in response to a momentary actuation of the manually operable switch when said first rotatable means is in any of said plurality of detent positions;

means interconnecting said power circuit means, first switching means, third switching means and second switching means to drive said second motor in response to a momentary actuation of said manually operable switch when said first rotatable means is in said reference position and when said second rotatable means is in one of said plurality of detent positions;

means interconnecting said power circuit means, first switching means, third switching means, second switching means and fourth switching means to drive said first motor in response to a momentary actuation of the said manually operable switch when said first and second rotatable means are both in said reference positions;

means interconnecting said power circuit means, first switching means, third switching means and said first motor to maintain said first motor energized when said manually operable switch is held closed during the time said first motor drives said first rotatable means through its reference position;

means interconnecting the power circuit means, the first switching means, third switching means and said fourth switching means and said second motor to maintain said second motor energized when said first rotatable means is in said reference position and when said manually operable switch is held closed during the time said second motor drives said second switching means through its reference position.

6. A motor control system as defined in claim 5 including:

means interconnecting said first switching means, second switching means and said power circuit means with said first and second motors to energize said first and second motors in response to actuation of said manually operable switch when said first rotatable means is in one of said plurality of detent positions and said second rotatable means is in its reference position.

7. A motor control system as defined in claim 6 including:

fifth switching means actuated by a cam driven by said first motor wherein said fifth switching means opens at angular positions just preceding each detent stop position and said reference position of the first rotatable means;

sixth switching means actuated by a cam driven by said second motor wherein said sixth switching means opens at angular positions just preceding each detent stop position and said reference position of a second rotatable means;

means interconnecting said first motor, fifth switching means, third switching means and power circuit means to drive said first rotatable means to one of said plurality of detent positions when said first motor is energized by said manually operable switch;

means interconnecting said second motor, sixth switching means, said fourth switching means and power circuit means to drive said second rotatable means to one of said plurality of detent positions when said second motor is energized by said manually operable switch.

8. A motor control system defined in claim 7 including:

a plurality of angularly spaced adjustable control elements mounted on said first rotatable means corresponding to the plurality of said detent positions;

a plurality of angularly spaced adjustable control elements mounted on said second rotatable means corresponding to the plurality of said detent positions;

seventh switching means;

the control element of said first rotatable means being adjusted to selectively actuate, successively, said seventh switching means as said first rotatable means is driven from one detent position to the next;

eighth switching means;

the control elements of said second rotatable means being adjusted to selectively actuate, successively, said eighth switching means as said second rotatable means is driven from one detent position to the next;

means connecting said seventh switching means, fifth switching means, third switching means and power circuit means to maintain the power circuit to said first motor, completed when said first motor drives said first rotatable means through a given detent position where the control element of said first rotatable means corresponding to said given detent positions is adjusted to close the seventh switching means;

means connecting said eighth switching means, sixth switching means, fourth switching means and power circuit means to maintain the power circuit to said second motor, completed when said second motor drives said second rotatable means through a given detent position where the control element of said second rotatable means corresponding to said given detent position is adjusted to actuate the eighth switching means.

References Cited by the Examiner

UNITED STATES PATENTS 3,179,907 4/1965 Brand et al. ---------- 334—29

ORIS L. RADER, *Primary Examiner.*

T. LYNCH, *Assistant Examiner.*